US005341109A

United States Patent [19]

Ryat

[11] Patent Number: 5,341,109

[45] Date of Patent: Aug. 23, 1994

[54] CURRENT MIRROR CIRCUIT

[75] Inventor: Marc H. Ryat, Santa Clara, Calif.

[73] Assignee: SGS-Thomson Microelectronics, Inc., Carrollton, Tex.

[21] Appl. No.: 665

[22] Filed: Jan. 5, 1993

[51] Int. Cl.5 ................................................ H03F 3/04

[52] U.S. Cl. ...................................... 330/288; 323/316

[58] Field of Search ................ 330/288; 323/315, 316, 323/317

[56] References Cited

U.S. PATENT DOCUMENTS 4,263,562 4/1981 Seiler .............................. 330/288 X 4,429,270 1/1984 Davies et al. ........................ 323/317

*Primary Examiner*—James B. Mullins

*Attorney, Agent, or Firm*—Kenneth C. Hill; Lisa K. Jorgenson; Richard K. Robinson

[57] ABSTRACT

A transistor circuit is provided which generates a collector current through an output transistor which is equal to the base current of a selected transistor in the circuit. This generated base current can be utilized in a variety of applications. Once such application is its use in an accurate cascode current mirror having an output current which is a predetermined multiple of an input current.

11 Claims, 1 Drawing Sheet

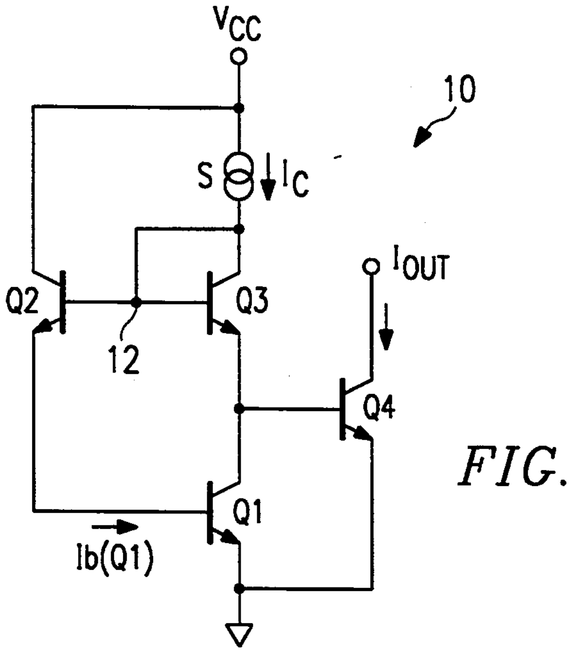
*FIG. 1*
*FIG. 2*
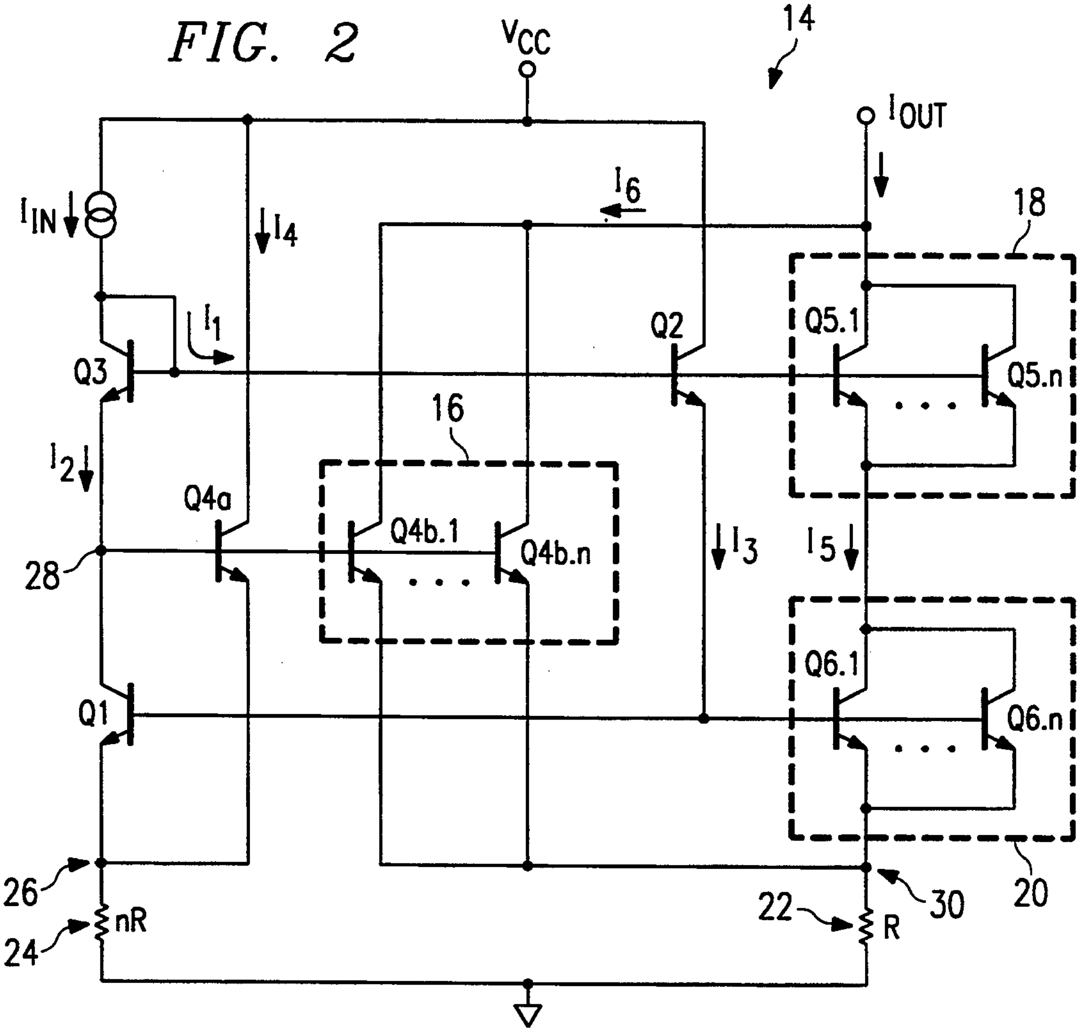

CURRENT MIRROR CIRCUIT

BACKGROUND OF THE INVENTION

1. Field of the Invention

The present invention relates generally to electronic circuits, and more specifically to circuits for generating output currents proportional to an input current.

2. Description of the Prior Art

In many types of electronic circuits, it is necessary to provide voltages or currents having fixed ratios with respect to other voltages or currents. For example, many electronic circuits use current mirrors to provide an output current proportional to the input current. Current mirrors and similar current sources are typically used in analog electronic devices for biasing other circuitry into its proper operating range.

In simple current mirrors, the current through an output transistor is driven to be identical to that through an input transistor. In other circuits, the output current is desired to be a fixed ratio, such as two times or three times, that of the input current. An example of the latter circuit is a Wilson mirror, which provides for a current ratio effect as known in the art. Wilson mirrors are known to provide high output impedance, but the precision of the mirrored current ratio is poor.

It would be desirable to provide a transistor circuit having an output current which is an accurate ratio reflecting an input current.

SUMMARY OF THE INVENTION

Therefore, according to the present invention, a transistor circuit is provided which generates a collector current through an output transistor which is equal to the base current of a selected transistor in the circuit. This generated base current can be utilized in a variety of applications. One such application is its use in an accurate cascode current mirror having an output current which is a predetermined multiple of an input current.

BRIEF DESCRIPTION OF THE DRAWINGS

The believed novel features of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIG. 1 is a schematic diagram of a preferred circuit for generating an output transistor collector current equal to the base current of a selected transistor; and FIG. 2 is a schematic diagram of a cascode current mirror circuit having an output current which is a preselected ratio of an input current.

DESCRIPTION OF THE PREFERRED EMBODIMENT

Referring to FIG. 1, a circuit 10 is shown for generating an output current equal to the base current of a selected transistor. Transistors Q1, Q2, Q3, and Q4, are connected as shown. A current source S is provided as known in the art, and generates a fixed current Ic as shown. The circuit 10 generates an output current Iout, which is the collector current of transistor Q4. As will be shown, the current Iout is equal to the current Ib(Q1). The following description assumes that all of the transistors Q1, Q2, Q3, and Q4 are identical. Such assumption is reasonable when the transistors are fabricated as part of a monolithic integrated circuit. Even variations in the processing of the integrated circuit device will not effect the similarity of the devices, because they are all fabricated at the same time.

It is well known that the base emitter voltage for a transistor is given by the following equation:

$$V_{be} = V_T \ln\left(\frac{I_c}{I_s}\right) \quad (1)$$

where $V_{be}$ is the base emitter junction voltage, $V_T$ is a constant depending on temperature, $I_c$ is the collector current, and $I_s$ is the saturation current of the transistor. $I_s$ remains constant at a given temperature.

Using loop equations beginning at the voltage at node 12, it will be apparent that $$V_{be}(Q2) + V_{be}(Q1) = V_{be})(Q3) + V_{be}(Q4) \quad (2)$$

rewriting equation (2) to solve for $V_{be}(Q4)$ gives $$V_{be}(Q4) = V_T \ln\left(\frac{I_{c1} \times I_{c2}}{I_s \times I_{c3}}\right) \quad (3)$$

because $$V_{be}(Q4) = V_T \ln\left(\frac{I_{c4}}{I_s}\right) \quad (4)$$

then $$I_{c4} = \frac{I_{c1} \times I_{c2}}{I_{c3}} \quad (5)$$

Because $I_{c1}$ and $I_{c3}$ are equal, it is apparent that the collector currents through Q2 and Q4 are the same. As shown in FIG. 1, the current through Q2 is equal to the base current through Q1. Therefore, $$Iout = Ib(Q1) \quad (6)$$

Those skilled in the art will realize that there may be numerous situations in which generating an output current through a transistor which is equal to the base current into another transistor can have useful applications. One such circuit 14 is shown in FIG. 2. This circuit is an accurate cascode current mirror, and generates an output current Iout which is a preselected multiple of the input current Iin.

All of the transistors in FIG. 2 are assumed to be identical. As before, they are all assumed to be operating in their linear mode, and have identical saturation currents $I_S$.

Circuit 14 is analogous to the circuit 10 of FIG. 1, with the addition of some extra transistors. Transistors Q1, Q2, and Q3 correspond to FIG. 1. Transistor Q4*a*, plus the group 16 of transistors Q4*b*.1 through Q4*b*.*n*, correspond to output transistor Q4 of FIG. 1. The group of transistors 16 represents some number, n, of identical transistors. The number, n, of identical transistors determines the multiplier factor to be applied to the gain of the current mirror. Groups of transistors 18 and also have the same number, n, of identical transistors.

In general, the transistor group 18 mirrors with transistor Q3 to provide a multiplied current output. Similarly, transistor group 20 and transistor Q1 are mirrored, and driven by the output of transistor Q2. As will be recognized by those skilled in the art, a current multiplication function can be realized using only these transistors, and excluding transistors Q4*a* and transistor group 16. However, such a circuit suffers from poor precision in the manner of circuits previously known in the art.

The inclusion of transistors Q4*a* and group of transistors 16, properly accounts for base currents and provides a precision multiplier. Resistor 22 has a selected value, and resistor 24 has a value which is n times the value of resistor 22. Because the current flowing through resistor 22 is n times as large as that flowing through resistor 24, the voltages across these resistors are equal and the bias conditions of the circuit remain balanced. The resistors 22, 24 may be eliminated, if desired, but the current multiplying precision of the circuit will suffer somewhat if Q1 and transistor group 20 are not well matched.

In FIG. 2, current $I_1$ provides the base current for transistors Q3 and transistor group 18. Thus, $$I_1=(n+1)Ib \tag{7}$$

The current through transistor Q3, $I_2$, is therefore $$I_2=Iin-(n+1)Ib \tag{8}$$

Transistor Q2 drives the bases of all of transistors Q1 and the transistor group 20. Thus current $I_3$ is $$I_3=(n+1)Ib \tag{9}$$

By using equation (2) above, with $V_{be}$(Q4) being the base-emitter voltage of transistor Q4*a* of FIG. 2, current $I_4$ is calculated to have the same value as $I_3$; that is, (n+1)Ib. The current, $I_4$, flowing through transistor Q4*a* is added back to the current flowing through resistor 24 at node 26.

The current $I_5$ flows between transistor groups 18 and 20 and then through resistor 22. Current $I_5$ has the magnitude $$I_5=n[Iin-(n+1)Ib] \tag{10}$$

because transistor group 20 acts as an n-times current mirror for transistor Q1.

Each transistor of transistor group 16 is driven by the same base current as transistor Q4*a*. Therefore, the current through each of transistors Q4*b*.1 through Q4*b*.*n* has the same magnitude as $I_4$. Summing all of these currents, the current $I_6$ has the magnitude $$Ib=n(n+1)Ib \tag{11}$$

the current $I_6$ is then added back into the current $I_5$ at node 30, in order to pass through resistor 22 so that the voltage drops across resistors 22 and 24 are equal.

Iout is equal to the sum of currents $I_5$ and $I_6$. Iout therefore has the value $$\begin{aligned} Iout &= n[Iin-(n+1)Ib]+n(n+1)Ib \\ &= nIin-n(n+1)Ib+n(n+1)Ib \\ &= nIin \end{aligned} \tag{12}$$

Therefore, Iout is exactly a multiple of Iin equal to the number of identical transistors in each of the transistor groups 16, 18 and 20. The operation of transistors, Q4*a* and transistor group 16, compensates for the asymmetrical base currents normally lost to drive the transistors of the current mirror.

It will be apparent to those skilled in the art that the basic circuit of FIG. 1 therefore has a useful implementation in the high precision current mirror of FIG. 2. The precision of this mirror is substantially greater than that of prior art designs, with simulations indicating that precision improvements of greater than an order of magnitude are typical. The current mirror of FIG. 2 is relatively straightforward, and can be easily used to replace prior art current mirrors in many integrated circuit devices requiring well defined current sources.

While it has been described with reference to a preferred embodiment, it will be understood by those skilled in the art that various changes in form and detail may be made therein without departing from the spirit and scope of the invention.

What is claimed is:

1. A circuit for generating a selected output current, comprising:

first and second bipolar transistors forming a current mirror;

a current source connected to said current mirror in series with the second transistor;

a third bipolar transistor connected in series with said second bipolar transistor, and having a base current supplied by the first transistor; and an output transistor connected to said current mirror to generate an output current equal to a base current of the third transistor.

2. The circuit of claim 1, wherein all of the bipolar transistors comprise NPN transistors.

3. The circuit of claim 1, wherein said output transistor has a base connected to a common node connected to the second transistor emitter and the third transistor collector.

4. A circuit for generating a selected output current, comprising:

a current mirror having first and second bipolar transistors having bases connected to a common node, such common node also connected to a collector of the second transistor, wherein a collector of the first transistor is connected to a first supply terminal;

a current source connected to the second transistor collector;

a third transistor having a collector connected to an emitter of the second transistor, a base connected to an emitter of the first transistor, and an emitter connected to a second supply terminal; and an output transistor connected to said current mirror to generate an output current equal to a base current of the third transistor.

5. The circuit of claim 4, wherein said output transistor has a base connected to the collector of the third transistor, an emitter connected to the second supply terminal, and a collector connected to an output terminal, wherein the collector current of the output transistor is equal to the base current of the third transistor.

6. The circuit of claim 5, wherein all of the transistors comprise NPN transistors.

7. The circuit of claim 4, wherein the first supply terminal comprises a positive terminal, and the second supply terminal comprises ground.

8. The circuit of claim 4 further comprising:

a first transistor group having a collector terminal connected to an output node, a base terminal connected to the common node, and an emitter terminal;

a second transistor group having a collector connected to the first group emitter terminal, a base terminal connected to the emitter of the first transistor, and an emitter terminal; and a third transistor group having a base terminal connected to the base of the output transistor, an emitter terminal connected to the second group emitter terminal, and a collector terminal connected to the output terminal.

9. The circuit of claim 8, wherein the second group emitter terminal is connected to the second supply terminal through a first resistor, and the emitter of the third transistor is connected to the second supply terminal through a second resistor.

10. The circuit of claim 8, wherein each of said first, second, and third resistor groups comprises a number, n, of identical transistors having base, collector, and emitter terminals all connected in parallel within the group.

11. The circuit of claim 10, wherein the second group emitter terminal is connected to the second supply terminal through a first resistor having a first value, and the emitter of the third transistor is connected to the second supply terminal through a second resistor having a second value n times larger than the first value.

* * * * *